United States Patent [19]
Hofmeister

[11] Patent Number: 5,997,235
[45] Date of Patent: Dec. 7, 1999

[54] SWAP OUT PLATE AND ASSEMBLY

[75] Inventor: Christopher A. Hofmeister, Hampstead, N.H.

[73] Assignee: Brooks Automation, Inc., Chelmsford, Mass.

[21] Appl. No.: 08/716,995

[22] Filed: Sep. 20, 1996

[51] Int. Cl.[6] ..................................................... B65G 1/06
[52] U.S. Cl. .......................................... 414/217; 414/939
[58] Field of Search ...................... 414/217, 416, 414/937, 939; 118/719; 204/298.25, 298.35

[56] References Cited

U.S. PATENT DOCUMENTS

| | | | |
|---|---|---|---|
| 4,717,461 | 1/1988 | Strahl et al. | 414/939 X |
| 5,080,549 | 1/1992 | Goodwin et al. | 414/939 X |
| 5,295,777 | 3/1994 | Hodos | 414/939 X |
| 5,387,067 | 2/1995 | Grunes | 414/939 X |
| 5,405,230 | 4/1995 | Ono et al. | 414/939 X |
| 5,435,682 | 7/1995 | Crabb et al. | 414/939 X |
| 5,445,491 | 8/1995 | Nakagawa et al. | 414/939 X |
| 5,447,409 | 9/1995 | Grunes et al. | 414/939 X |
| 5,474,410 | 12/1995 | Ozawa et al. | 414/939 X |
| 5,588,789 | 12/1996 | Muka et al. | 414/939 X |

FOREIGN PATENT DOCUMENTS

| | | | |
|---|---|---|---|
| 64239 | 3/1989 | Japan | 414/939 |
| 6314730 | 11/1994 | Japan | 414/939 |

*Primary Examiner*—David A. Bucci
*Attorney, Agent, or Firm*—Perman & Green, LLP

[57] ABSTRACT

A load lock is comprised of a housing defining a partial chamber therein opening to a first face, the load lock defining a given point on which the center of a substrate is supported. A swap out plate is secured to the load lock and covers the first face thereof. The swap out plate defines a partial chamber therein and has a horizontally extending slot communicating with the chamber. A substrate support is secured to the load lock for supporting a substrate thereon such that the supported substrate extends between the swap out plate partial chamber and the load lock partial chamber.

22 Claims, 11 Drawing Sheets

SWAP OUT PLATE AND ASSEMBLY

FIELD OF THE INVENTION

The apparatus of the present invention relates generally to material transfer devices. The material transferred might include, but not be limited to, semiconductor wafers, such as Silicon and Gallium Arsenide, semiconductor packaging substrates, such as High Density Interconnects, semiconductor manufacturing process imaging plates, such as masks or reticles, and large area display panels, such as Active Matrix LCD substrates.

BACKGROUND OF THE INVENTION

The present invention relates generally to material transfer devices, and in particular, to improvements in material transfer devices wherein the device structure is standardized and a fitted swap out plate is used to accommodate variations in the angular relationship between the transfer device and the transport chamber to which the transfer device is connected.

In the fabrication of planar substrates or articles, it is well known to employ a processing chamber within a clean room and to supply a batch of substrates to be processed using two stations situated in a side-by-side fashion and connected to the transport chamber. Within the transport chamber is provided a transport apparatus which is capable of selectively extending a substrate holder into one of the side-by-side loading and unloading stations. In addition, the transfer apparatus is capable of rotating in 360° to move a substrate holder into one of the number of processing stations which are disposed about the chamber. In this way, the transport apparatus is capable of moving a substrate between selective ones of the processing stations, as well as between each of the loading stations as prescribed by a controller. A load lock is provided and functions to move substrates from one position to another irrespective of the number of the processing modules which are coupled to the processing chamber. The functions of each processing chamber are however primarily dictated by manufacturers specific requirements. For example, a transport chamber might require connection with six separate processing modules which must be connected to it in such a manner as to allow the transport apparatus to move radially outwardly to each of the processing modules from a common center disposed within the transport chamber. However, the number of processing modules which are used and attached to the process chamber, determines the angular faces of the transport chamber. As such the angular faces change with the number of process modules added, e.g. number of side faces to be attached. As illustrated in the prior art drawings of FIGS. 1a through 1e, the systems which are used in the manufacture of such substrates can vary from a three processing station system as shown in FIG. 1a, up to as many as a six or seven processing stations, as illustrated in FIG. 1e. In addition, each system must be able to handle wafer sizes of up to 300 mm in diameter. In addition, the system must be configured and designed to meet SEMI/MESC standards. In the past, one answer to this situation was to rework the configuration of the load lock stations to accommodate the different angles which existed between the load lock and transport chamber. However, the customizing of each load lock station involved a significant amount of labor and expense which otherwise would be desirably avoided.

In addition to the above, there is also a need to provide a high throughput transport device which can move a substrate or workpiece between remote locations within highly confined areas as defined by a limited footprint. This is because in the process of manufacturing, not just in the semiconductor industry, the need to move a workpiece from one position to the next, not only requires a high throughput rate, but also accuracy of repeatability of placement of workpieces in registration at predetermined orientations on a support surface. Still a further constraint is a to fabricate a positioning machine which is capable of working in a clean room environment where the existence of particulates is minimized, if not nonexistent.

Accordingly, it is an object of the present invention to provide an interface between a load lock and a transport chamber which is adaptable to connect a standardized load lock to a processing chamber with different configurations as defined by different angular faces in the processing chamber.

It is still a further object of the invention to provide an interface of the aforementioned type which is easily manufactured and can be readily connected to a standardized load lock assembly.

It is still a further object of the invention is to provide a system interface which is capable of working within a vacuum environment with exposure to wide ranges of vacuum.

Other objects of and advantages of the invention will become apparent by the following specification and appended claims.

SUMMARY OF THE INVENTION

The invention in its broadest aspects resides in a load lock comprised of a housing defining a partial chamber therein opening to a first face, the load lock defining a given point on which the center of a substrate is supported. A swap out plate is secured to the load lock and covers the first face thereof. The swap out plate defines a partial chamber therein and has a horizontally extending slot communicating with the chamber. A substrate support is secured to the load lock for supporting a substrate thereon such that the supported substrate extends between the swap out plate partial chamber and the load lock partial chamber.

The invention also resides in a processing station which includes a load lock having a partial chamber therein opening to a first face, the load lock defining a given point on which the center of a substrate is supported. A transport chamber is disposed adjacent the load lock and has a second face disposed generally oppositely of the first face of the load lock. A swap out plate is positioned between the load lock and the transport chamber and defines a partial chamber therewithin communicating with the partial chamber of the load lock and has a horizontally disposed slot communicating with a like slot in the second face of the transport chamber. The swap out plate has an abutment wall configured to engage the second wall of the transport apparatus and is dimensioned to space the given point on the load lock from the abutment wall a given distance irrespective of angular orientation occurring between the load lock first face and the transport chamber second face.

The processing station further may be comprised of a load lock having a partial chamber therein opening to a first face, the load lock defining a given point on which the center of a substrate is supported. A transfer device is secured to the load lock for moving substrates from one position outside the load lock to another position inside the load lock. The transport chamber is disposed adjacent the load lock and has a second face disposed generally oppositely of the first face of the load lock. A transport apparatus is disposed within the transport chamber and has at least one substrate holder for engaging and moving a substrate from the another position within the load lock to one or more processing stations disposed about the transport chamber. The transport apparatus moves the substrate holder a given stroke length along a given radius from a central axis. A swap out plate is positioned between the load lock and the transport station and defines a partial chamber therewithin communicating with the partial chamber of the load lock and having a horizontally disposed slot communicating with a like slot in the second face of the transport chamber. The transfer device supports the substrate within the load lock such that the substrate extends between the partial chambers of both the load lock and the swap out plate. The swap out plate has an abutment wall angled to mate with the second face of the transport chamber and has at least one side wall configured to space the center of the substrate supported in the load lock from the central axis irrespective of the angular orientation which exist between the load lock first face and the transport chamber second face.

Ideally the transfer device includes at least one substrate supporting structure which is complementarily engagable with the substrate holder of the transport apparatus and the at least one substrate supporting structure being an end effector which is oriented in line with the stroke of said substrate holder to effect complementary engagement between the end effector and the substrate holder of the transport apparatus.

BRIEF DESCRIPTION OF THE DRAWINGS

FIGS. 1a, 1b, 1c, 1d, 1e and 1f illustrate prior art configurations of systems in which the present invention may be employed.

DETAILED DESCRIPTION OF THE PREFERRED EMBODIMENTS

Figure 1C:
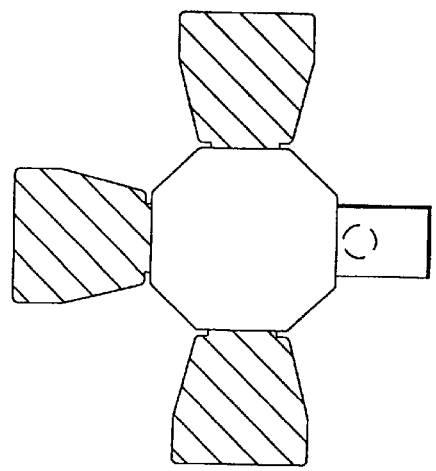
Figure 1B:
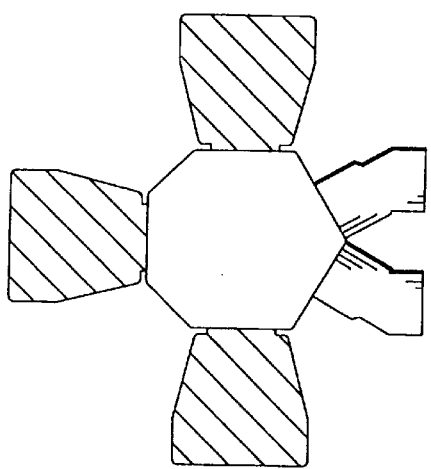
Figure 1A:
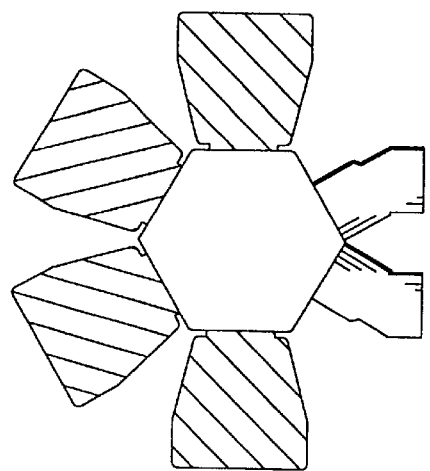
Figure 1F:
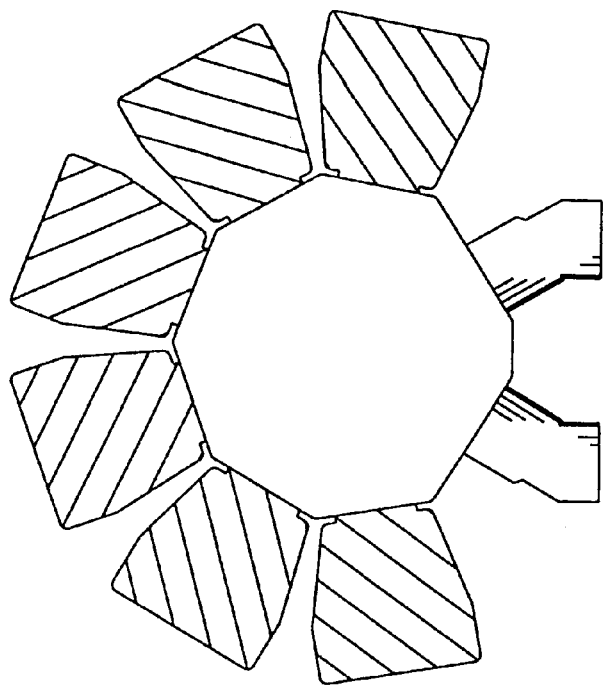
Figure 1E:
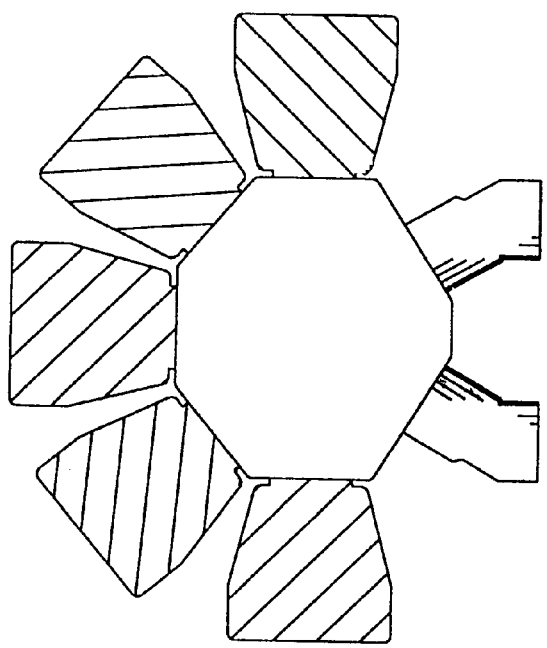
Figure 2:
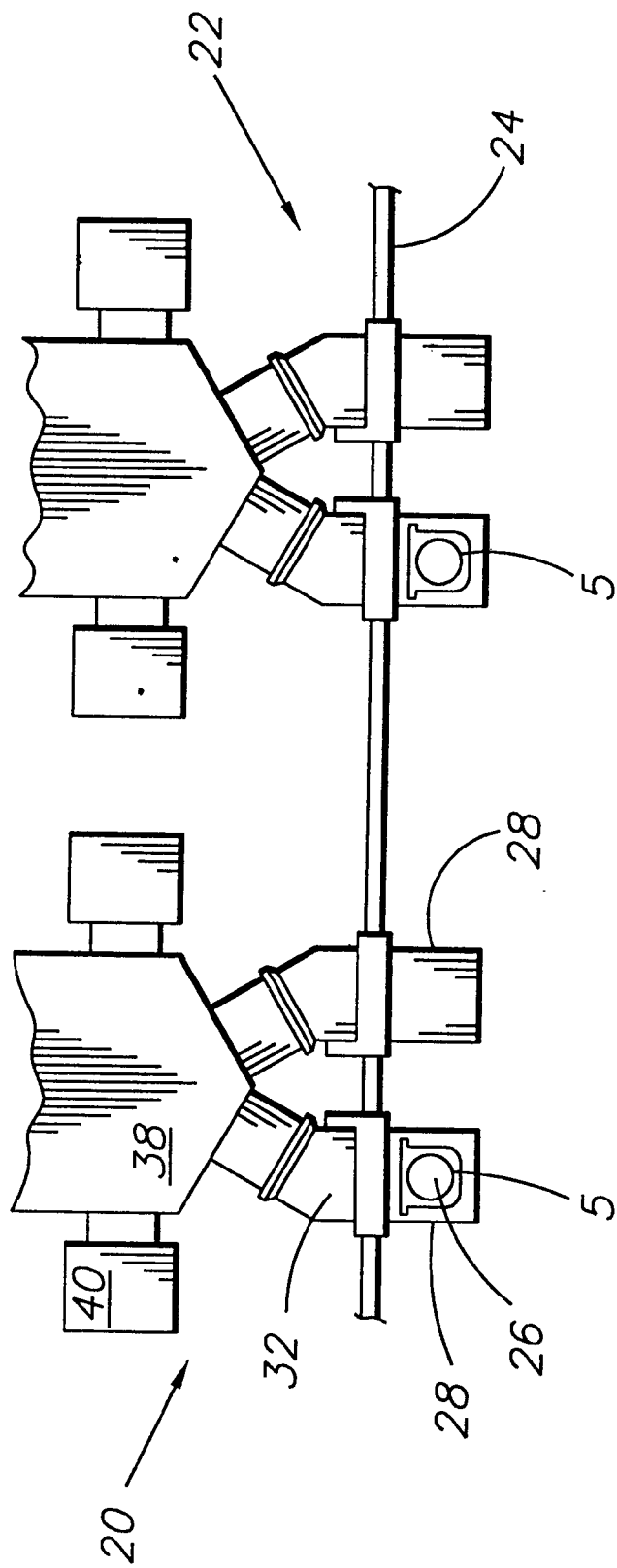
FIG. 2 is a partial fragmentary top plan diagrammatic view of a pair of side-by-side processing stations of the type capable of utilizing the system interface of the invention.

Turning now to the drawings, FIG. 2 illustrates a series of processing systems 20 for operating on planar substrates which may include wafers and flat panels. As noted earlier, the terms "wafer", or "substrate" will be used for purposes of consistency to refer to such substrates, but it will be understood that it is intended to be used in the broad context so as to be applicable to all substrates. The processing systems 20 may be arranged, for example, in side-by-side fashion within a "clean room" 22 separated from the outside environment by a wall 24. It may be possible to eliminate the clean room as a separate environment and, instead, maintain a desired clean environment within the system 20 and within each instrumentality which interfaces with the system.

In any case, it is customary to carry a large number of substrates or workpieces S (FIG. 2) within a cassette 26 or within a controlled environment carrier box 26'. In such instances, a plurality of the substrates are loaded into the cassette 26 or into the carrier box 26' where each is supported in a spaced, stacked, relationship, and then transported manually, or otherwise, and placed on a shelf 28 adjacent an associated system 20 to await entry for processing. The cassette is placed into a waiting chamber 30 within a load lock 32 when an entry door 34 (FIGS. 3 and 4) is opened enabling access through a load port 35 (FIG. 4). By means of a transfer device 36 which is articulated by a controller to be described, a plurality of the substrates S in the cassette 26 or in the controlled environment box 26' are lifted off the shelves of the cassette or box and moved in stacked form into the chamber 30 of the load lock station 32 in one motion of the device 36. Subsequently, by means of a transport apparatus 37 disposed within a transport chamber 38 connected to the load lock 32, the substrates S are moved one by one to the transport chamber 38 and, from there, to one or more of a plurality of processing stations 40.

Figure 3:
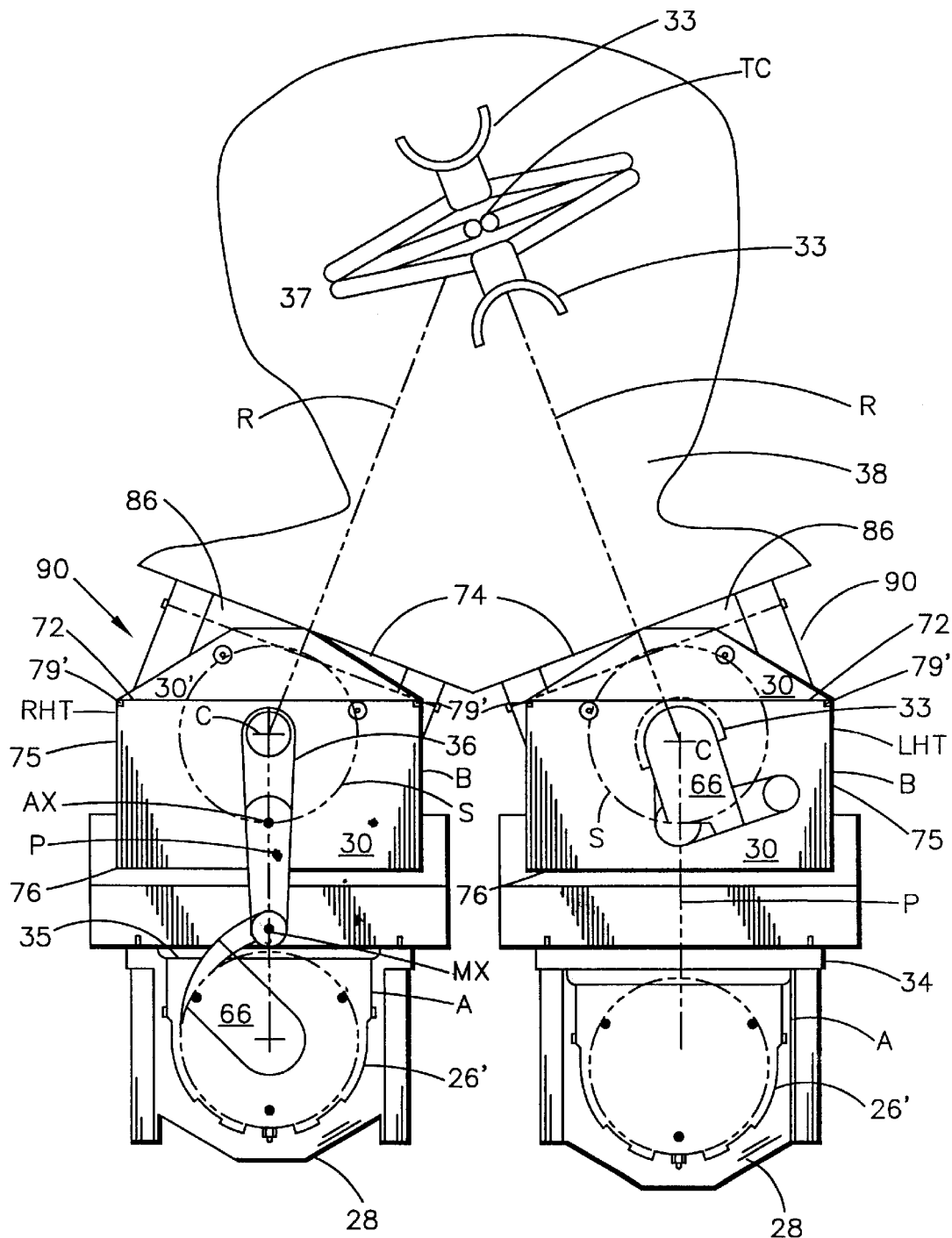
FIG. 3 is a top plan diagrammatic view illustrating, in greater detail, a pair of side-by-side load and unload stations utilizing the system interface of the present invention.
Figure 4:
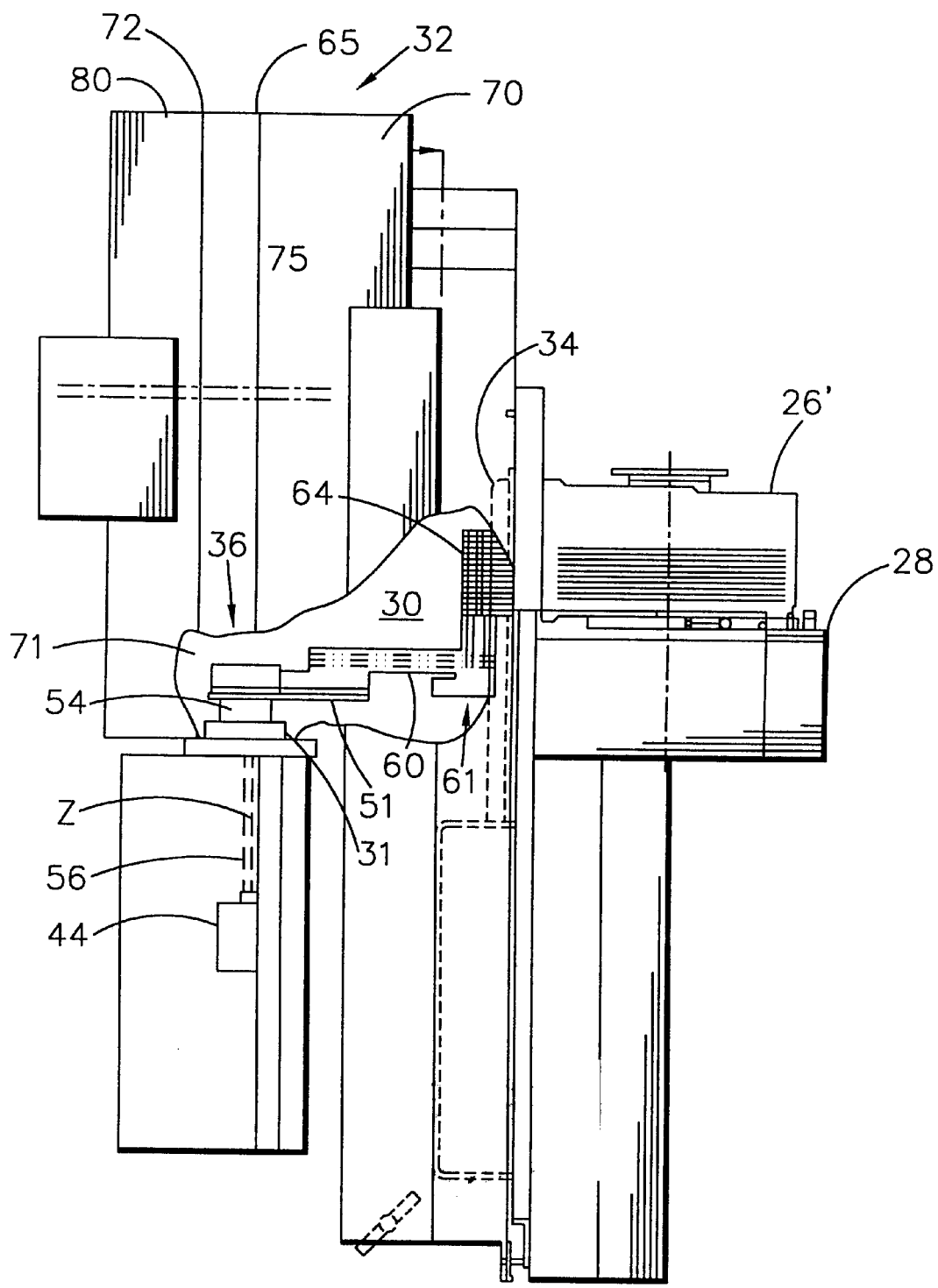
FIG. 4 is a partially fragmentary side elevation view of a load lock station of FIG. 3 showing in phantom line the access opening communicating with the system chamber.
Figure 5:
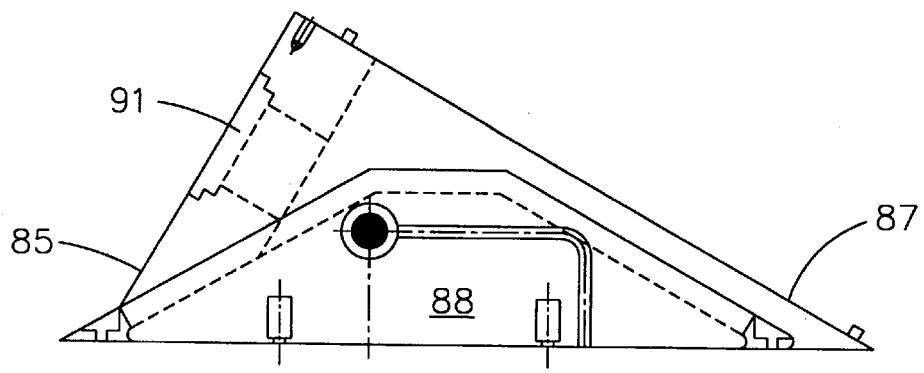
FIG. 5 is a top plan view of a right hand swap out plate.
Figure 6:
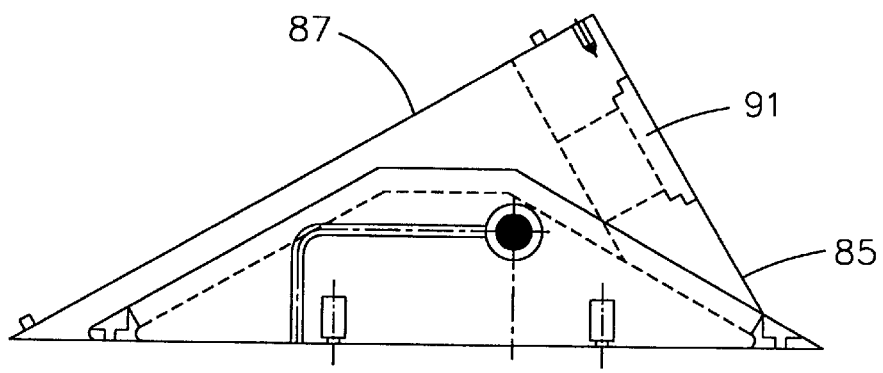
FIG. 6 is a top plan view of a left hand swap out plate.

As illustrated in FIGS. 3 and 4, the transfer device 36 is mounted to the top of an elevator mechanism 44 for vertical movement along the indicated Z-axis. The elevator mechanism 44 is supported within the load lock 32 and controllably, selectively positions the device 36 at different height locations for the purpose of positioning each substrate S for engagement with the transport apparatus 37. For this purpose, as seen in FIG. 4, the elevator mechanism 44 includes a shaft 56 which is drivingly connected to a lift tube 54 responsible for moving the shaft 56 in the vertical direction along the Z-axis. The transfer device 36 includes an articulated drive arm 60 thereon for rotation about the indicted axis AX. The free end of the drive arm 60 in turn supports a plurality 64 of end effectors 66 thereon which are arranged in a stacked arrangement and for rotational movement about the indicated axis MX. The drive arm 60 and the end effector plurality 64 are moveable both angularly and linearly relative to one another in order to move a stack of substrates S between the cassette support station and the chamber 30 of the load lock.

The transport apparatus 37 includes substrate holders 33,33 which are controllably moved by instructions from the controller into and out of the load lock chambers 30,30 in order to pick up a substrate S supported on an end effector 66 within a chamber 30 and move it to one of the processing modules for processing and to thereafter place the worked on substrate back into the chamber where it is supported on one of the end effectors 66.

Relative movement between the drive arm 60 and the end effector plurality 64, and between these elements taken relative to the load lock 32 is accomplished through the intermediary of a rotary actuator which is preferably provided as one component of the elevator mechanism 44. For a more complete description of the transfer device 36, reference may be had to copending U.S. application Ser. No. 08/716,943, filed Sep. 20, 1996 entitled COAXIAL DRIVE LOADER ARM, which is hereby incorporated by reference.

The transfer device 36 is capable of moving the center(s) C of the plurality of stacked substrates S (or even a single substrate) along a straight linear path as illustrated by the dashed line P extending between positions A—C in FIG. 3.

The positions A and C are respectively associated with a cassette load and unload position (location A) and a transport chamber load and unload position (location C). Thus, the linear straight line P identifies the path followed by the substrate S as between the cassette 26 and the internal confines 30 of the locking station 32.

In accordance with the invention, as illustrated in FIGS. 3 and 4, the load lock chamber 30 is defined by a generally two part housing comprised of a generally rectangular shaped open box housing part 70 and a mating swap out plate 80 which is correspondingly sized and shaped to sealingly connect to the open face 71 of the housing part 70 to substantially close off the load lock chamber 30. The generally rectangular shaped open box housing part 70 is defined by a long side 76 associated with the entry door 34 and two short sides 75,75 which connect with the long side 76 and to a top wall 65 and a bottom wall 67 to create a generally U-shaped closed end partial chamber. The open face 71 of the housing part 70 has a planar perimeter face 72 which mates with a like perimeter face 73 (see FIG. 8) on the swap-out plate 80 to effect a sealing engagement therebetween. The two mated parts are preferably bolted together, and to better effect connection of these parts, locating pins 79 and corresponding locating holes 79' on the face 72 of the load lock 32.

Figure 7:
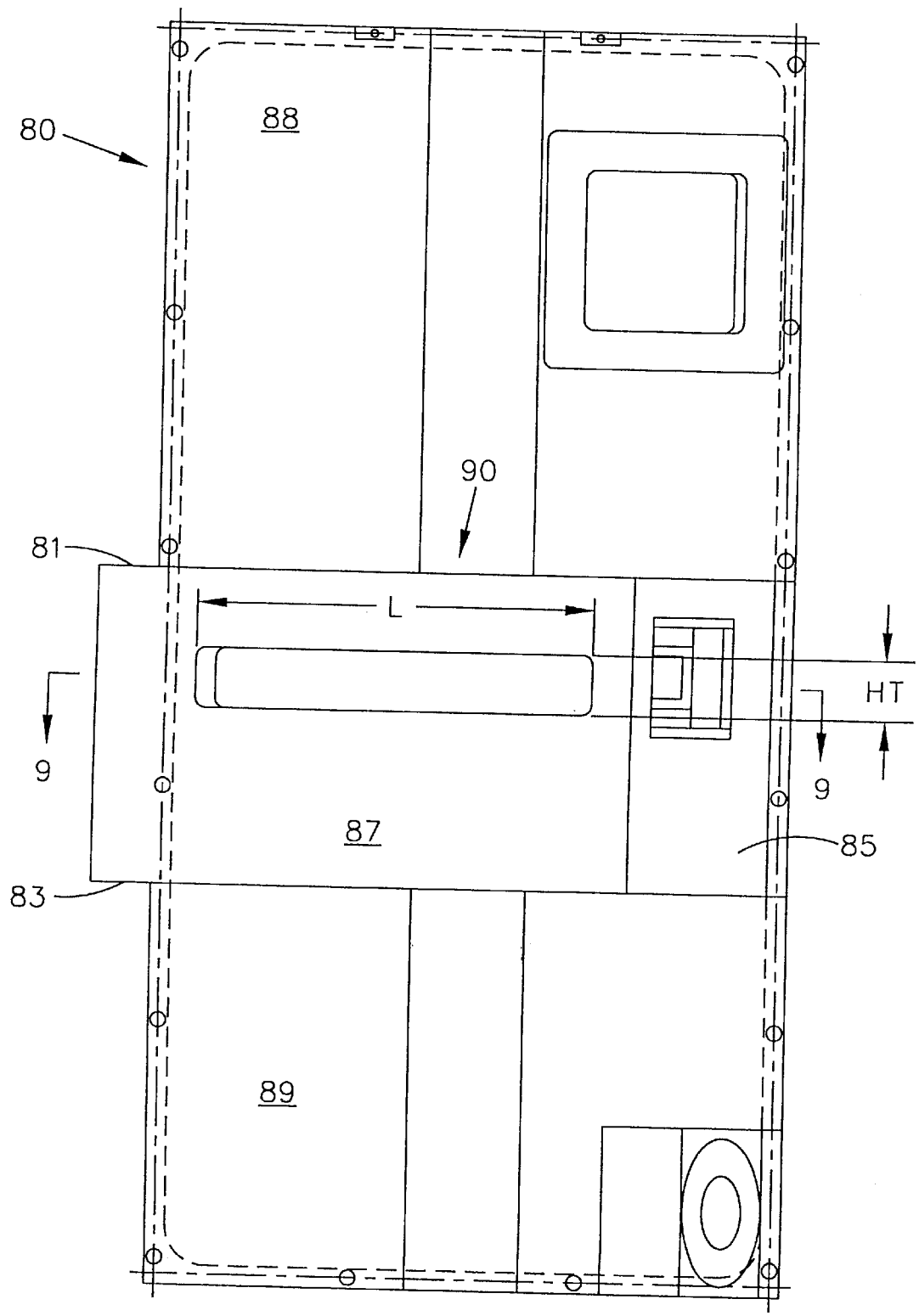
FIG. 7 is a front elevation view of the swap out plate shown in FIG. 5 as seen from the outside.
Figure 8:
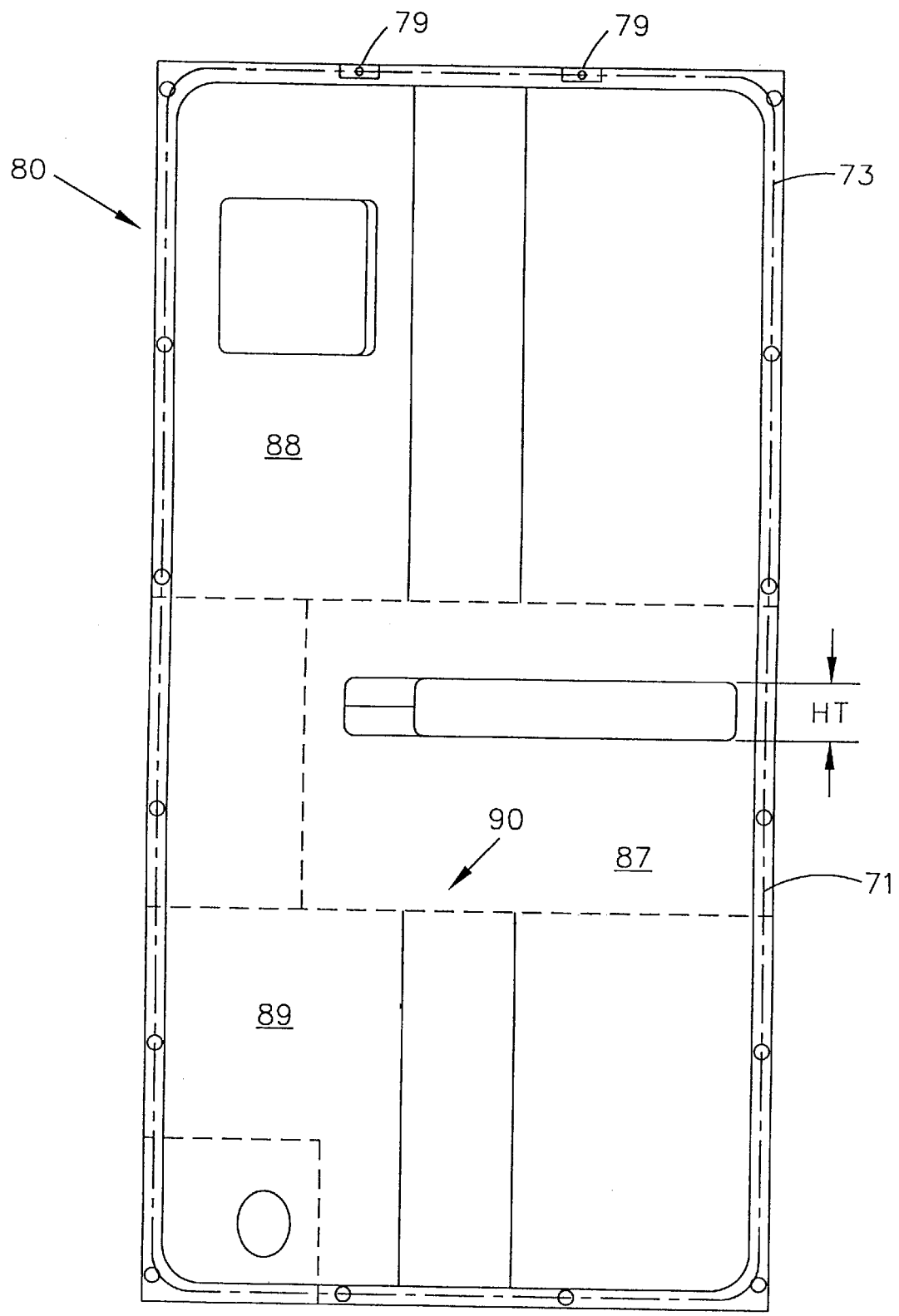
FIG. 8 is a rear elevation view of the swap out plate of FIG. 7 as seen from the inside.

The transport chamber 38 is a multi-sided structure having a plurality of side faces 74 which extend vertically and parallel to the vertically extending planar perimeter face 72 of the load lock 32. As best illustrated in FIGS. 7 and 8, the swap out plate 80 has top and bottom vertically extending three sided portions 88 and 89 which are integrally connected with a connecting tunnel 90 disposed therebetween. The connecting tunnel 90 is defined by top and bottom walls 81 and 83 and at least one sidewall 85 which are commonly connected to an abutment wall 87 which is clamped by bolting to a selected one of the side faces 74 of the transport chamber 38. Each sidewall 85 extends perpendicularly to the abutment wall 87 and has a given length D1 which corresponds to the dimension between the supported substrate center C and the abutment wall 87. The connecting tunnel 90 is thus stepped laterally outwardly of the planar portion 88 of the plate 80 so as to create a vacuum tight bridge between the load lock station 32 and the transport chamber 38. Vacuum in the tunnel 90 may be introduced through the intermediary of ducts 91 which communicate between the outer surface of the connecting tunnel and the chamber 30'.

Figure 9:
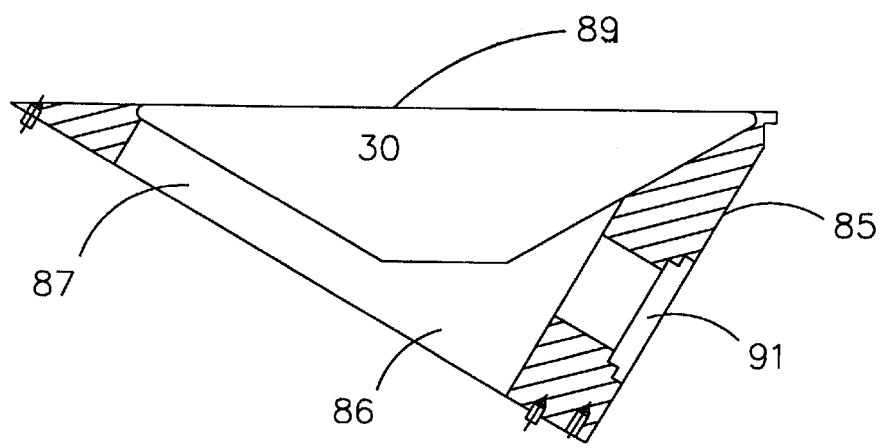
FIG. 9 is a horizontal sectional view taken along line 9—9 in FIG. 7.

As best illustrated in FIGS. 4, 7, 8 and 9, the abutment wall 87 includes a transversely extending slot 86 which communicates with and is aligned with a like opening formed in the involved one of the side face 74 of the transport chamber 38 to which the connecting tunnel 90 is attached. The slot 86 has a height HT sufficient to allow the substrate holder 33 of the apparatus 37 to be moved therethrough along with a substrate S carried along top the holder. The slot also has a length L of a size sufficient to permit a substrate of a diameter, for example 300 mm, to pass without interference therethrough while being held on the holder 33. As illustrated in FIG. 9, the reference numeral 30' is used to denote that the chamber in the load lock 32 is collectively comprised by a volume 30 of the load lock station 32 and by a volume 30' defined by the connecting tunnel 90 of the swap out plate 80. Thus, as can be seen in FIG. 3, the substrates S when in the transport chamber load and unload position (location B), will always occupy the chamber portion 30' provided by the connecting tunnel 90.

In further accordance with the invention, and as best illustrated in FIGS. 3–6, each load lock 32 has a standard fabrication essentially identical to other such load locks irrespective of the angular disposition of the faces 74 of the transport chamber 38 to which a given load lock is to be attached. That is, the transfer device 36 is secured to the structure of the load lock 32 so as to locate the articulated drive arm 60 and the plurality 64 of end effectors 66 in such a way as to position the substrates S at the location C. One way to insure this is to position the shaft 56 of the elevator mechanism 44 at point C. The point C is offset from the geometric center of the load lock generally rectangular shape, and thus positions the substrate center C more proximate the side face 72 than to the long side 76 so that the substrate occupies the chamber 30' of the swap out plate 80.

The formation of the side wall 85 on the right side of the connecting tunnel 90 results in a left handed connecting tunnel (FIG. 6) as is seen in assembly at the element LHT in FIG. 3, and the formation of the side wall 85 on the left side of the connecting tunnel 90 (FIG. 7) results in a right handed connecting tunnel as identified by the element RHT in the same figure. As best illustrated in FIG. 10*a*, the formation of two side walls 85,85 of equal length connected to the abutment wall 87 at the ends thereof, results in a zero degree connecting tunnel whose abutment wall 87 is disposed in a parallel with the long side of the load lock 32.

It is a feature of the invention to provide a swap out plate 80,80 of the type shown in FIGS. 10*a*–10*f* and usable in a system of the type shown in FIG. 4, which accommodates different angular orientations of the side faces 74 of the transport chamber 38. To these ends, and as illustrated in FIG. 4, each load lock 32 can be fitted with a swap out plate 80 corresponding to the angle of the face 74 of the transport chamber 38 to which it is fitted. As previously discussed, the swap out plate 80 can have a right or a left hand configuration, or a zero degree configuration. Regardless of angular orientation, each swap out plate 80 is fitted between the load lock 32 and a face 74 of the transport chamber 38 so as to locate the centers C of the substrates S at a constant radius R from the center TC of the transport apparatus 37. That is, the radius R defines the stroke length of the substrate holder 33 from the transport chamber center TC which is standard. Each substrate holder 33 is complimentarily configured to mate with the shape of the end effectors 66 when moved along the radius R so as to lift a substrate S off the involved end effector when relative vertical movement therebetween is effected by the vertical actuator 44. Thus, by angularly orienting the end effectors 66 in line with the radius R, and orienting the side wall(s) of the connecting tunnel 90 perpendicularly to the radius R, a standardized load lock can be provided without the need to relocate, for example, the position of the vertical shaft 56.

Figure 10A:
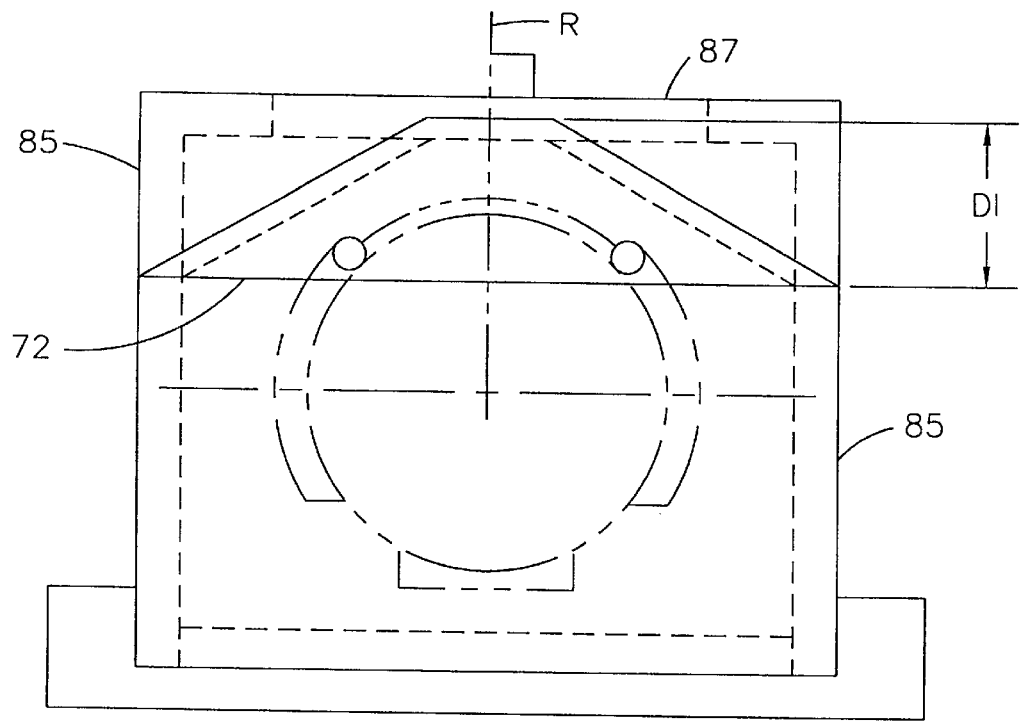
FIGS. 10a, 10b, 10c, 10d, 10e, and 10f illustrate the loading stations with various swap out plate configurations which can be provided in accordance with the invention.
Figure 10B:
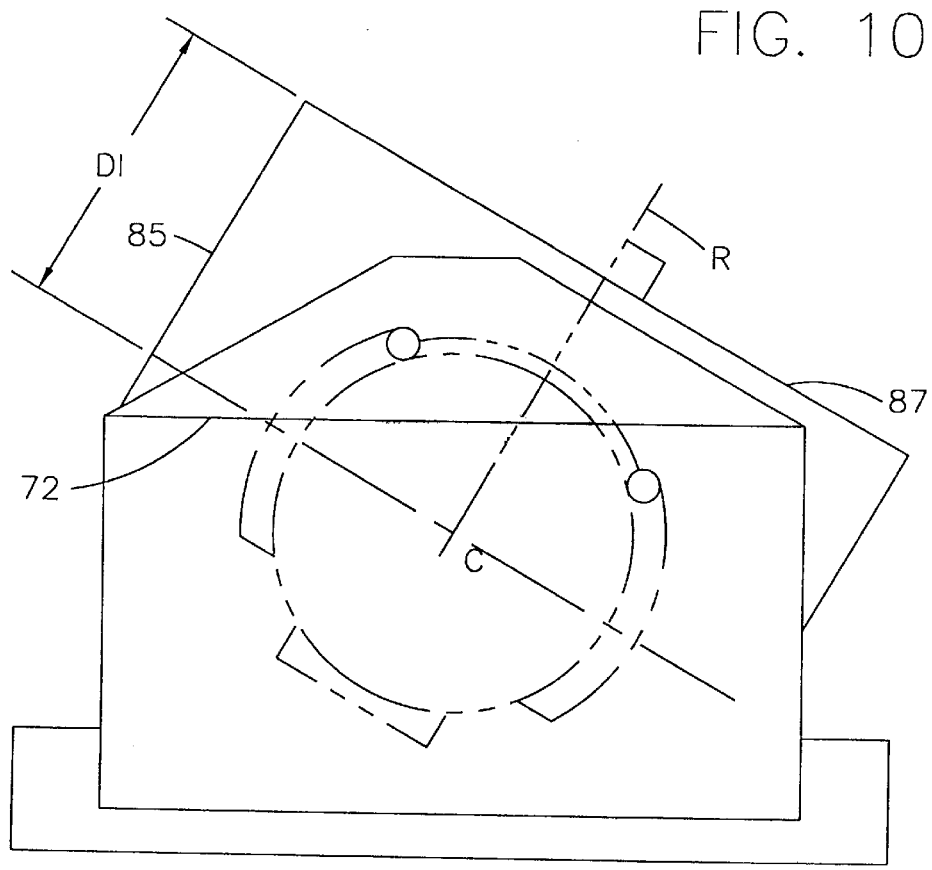
Figure 10C:
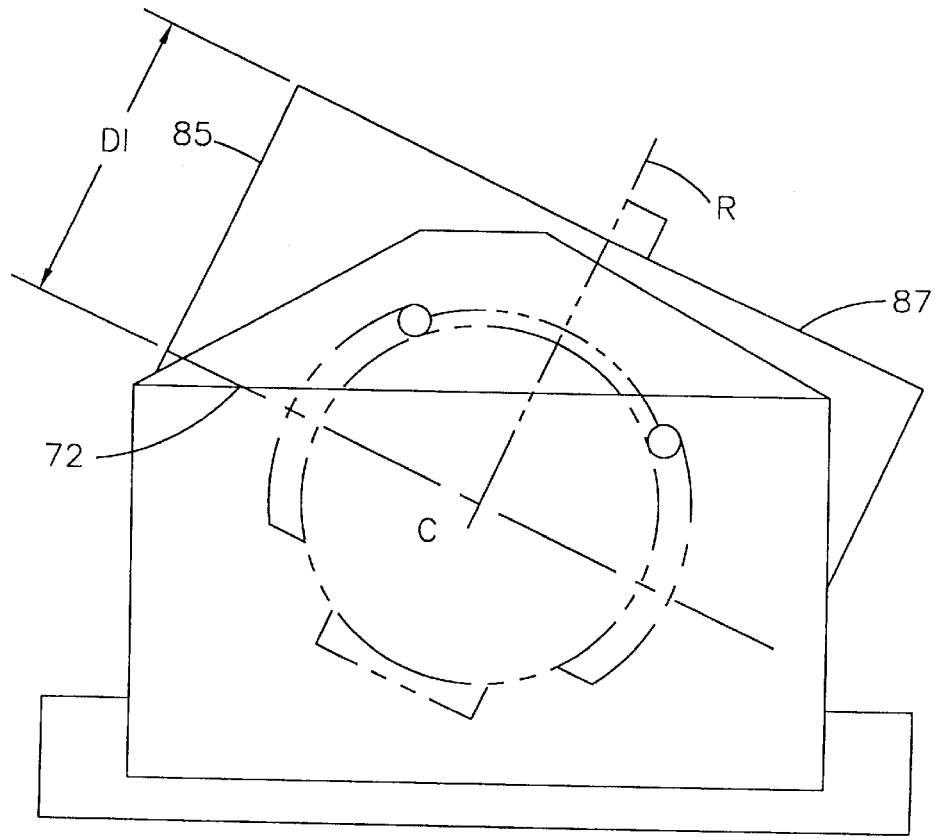
Figure 10D:
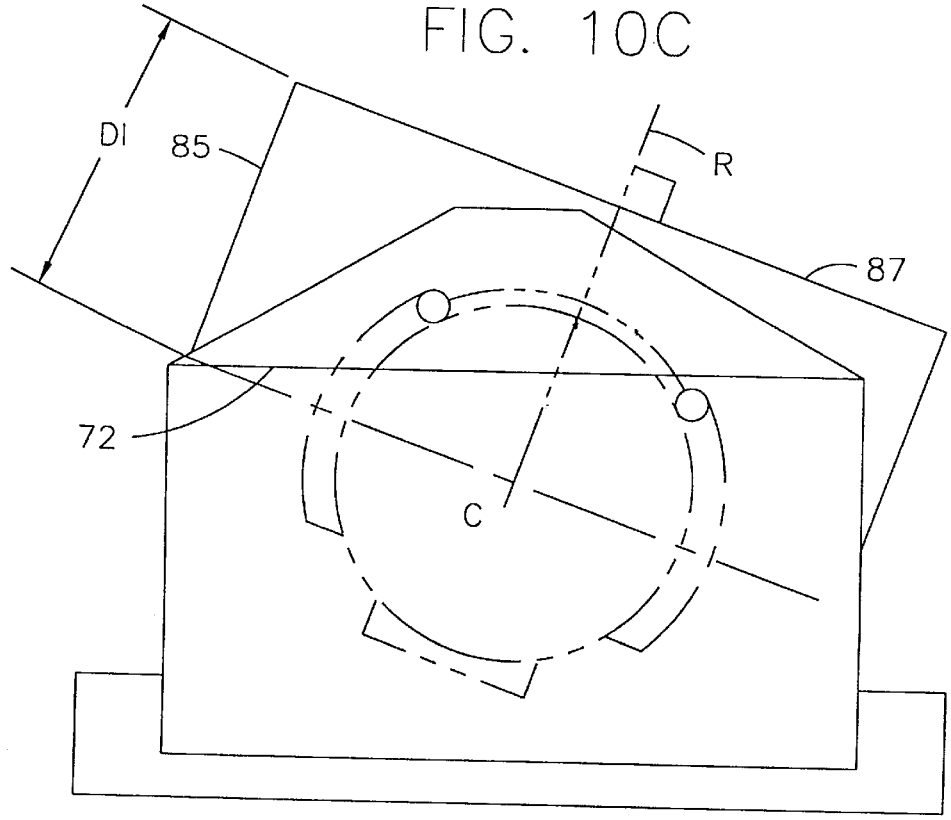
Figure 10E:
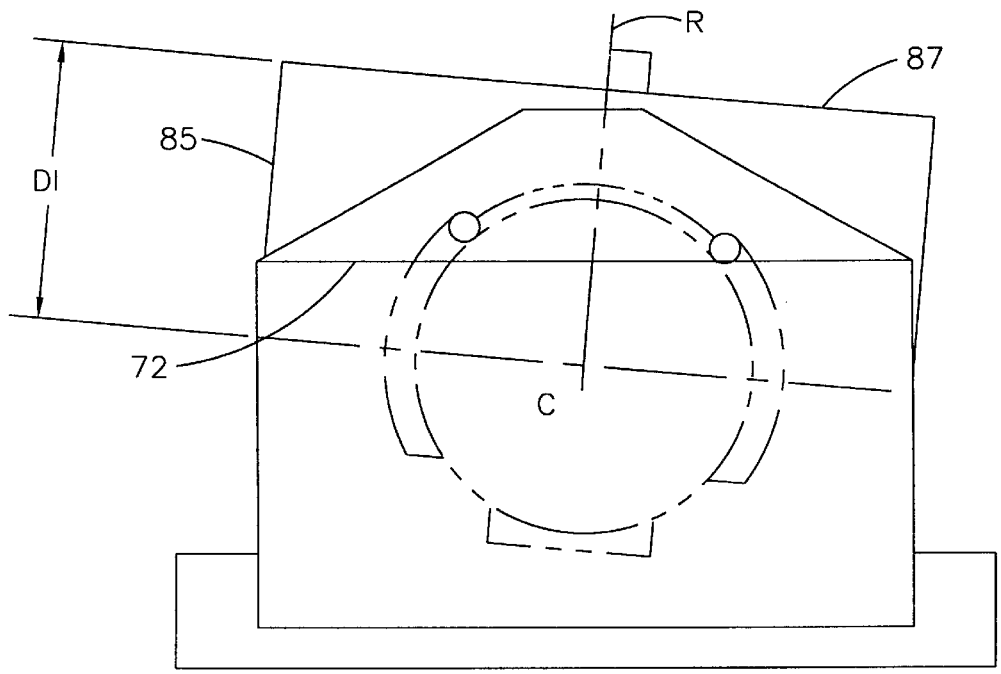
Figure 10F:
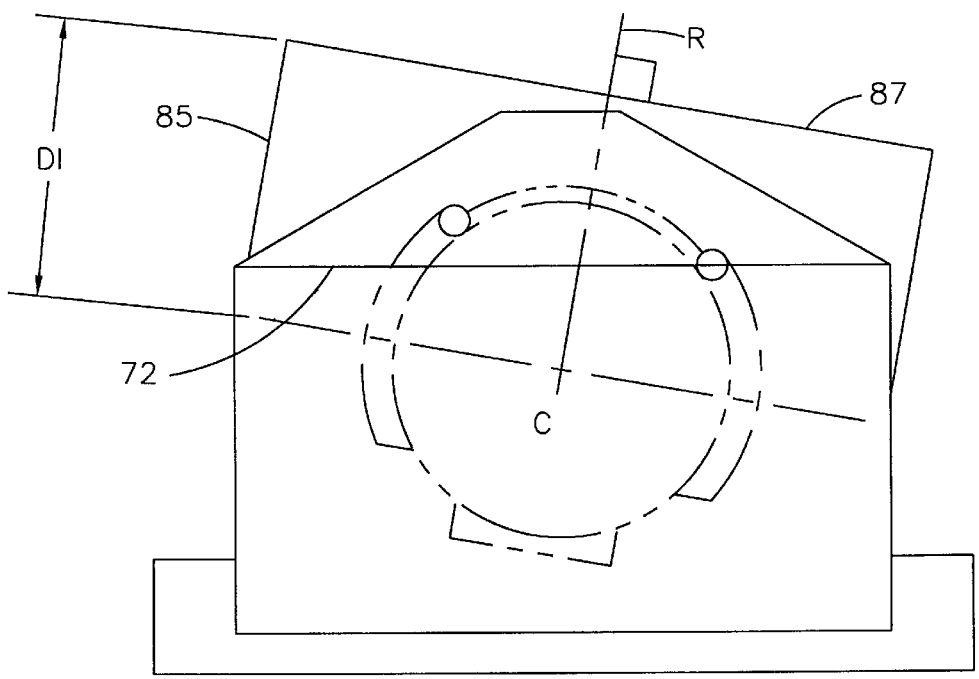

As illustrated in FIGS. 10*a*–10*f*, the configuration of the swap out plate may take several different forms, in the embodiment of FIG. 10*a*, the swap out plate has a 0° angular configuration. In FIG. 10*b*, the swap out plate is a right hand swap out plate with a 30° interface. As seen in FIG. 10*c*, the swap out plate has a 27.5 angle. In FIG. 10*d*, the swap out plate has a right oriented angle of 25°. The swap out plate shown in FIG. 10*e* has a reference angle of 22.5° while in FIG. 10*f*, the swap out plate has a 20° interface and a right disposition.

By the foregoing a transport chamber the aforementioned type has been described by way of the illustrated embodiments. However, numerous modifications and substitutions may be had without departing from the spirit of the invention. For example, in the embodiment described above, the transfer device 36 utilizes a batchloader arm, however it is well within the purview of the invention to provide within the load lock, a cassette elevator which positions the entire cassette at various levels along the Z-axis during the loading and unloading stages.

Accordingly, the invention has been described by way of illustration rather than limitation.

I claim:

1. A processing station including:
   a load lock having means for moving a plurality of substrates between atmosphere and a vacuum environment and having a partial chamber therein opening to a first face, said load lock defining a given point on which the center of a substrate is supported, said given point being a standardly located point found as between one load lock to another;
   a transport chamber disposed adjacent said load lock and having a second face disposed generally oppositely of the first face of said load lock and at a given angle;
   a swap out plate positioned between said load lock and said transport chamber and defining a partial chamber therewithin communicating directly and continuously with said partial chamber of said load lock to define together an enclosure, and said swap out plate having an abutment wall having a horizontally disposed slot communicating with a like slot in said second face of said transport chamber; and
   wherein said swap out plate abutment wall being integrally connected to at least one sidewall extending from said load lock and having a length sufficient to locate said abutment wall for orientation at a desired angle corresponding to said given angle of said second face of said transport chamber and at a given distance from said given point so as to uniformly locate said abutment wall in corresponding engagement with said second wall of said transport apparatus to thereby space said abutment wall from said given point on said load lock a given distance irrespective of angular orientation occurring between the load lock first face and the transport chamber second face.

2. An assembly as defined in claim 1 further characterized by said swap out plate includes a laterally extending connecting tunnel defined by said abutment wall and upper and lower vertically extending portions extending vertically upwardly and downwardly therefrom.

3. An assembly as defined in claim 2 further characterized by in that said horizontally extending slot is disposed in said abutment wall and said abutment wall is a vertically extending end wall of said connecting tunnel.

4. An assembly as defined in claim 3 further characterized by said connecting tunnel being defined by said at least one side wall which angles said abutment wall at a right hand disposition.

5. An assembly as defined in claim 4 further characterized by said swap out plate having a plurality of locating pins disposed thereabout and engaging with corresponding openings in said first face of said load lock.

6. An assembly as defined in claim 4 further characterized by said partial chamber within said load lock being sized so that said substrate is disposed in part within the partial chamber defined by said load lock and in part within said partial chamber defined by said swap out plate.

7. An assembly as defined in claim 1 further characterized by said swap out plate at least one side wall having a length substantially equal to the distance between the given point and said abutment wall.

8. An assembly as defined in claim 4 further characterized by said at least one side wall having a length substantially equal to the distance between the given point and said abutment wall.

9. An assembly as defined in claim 3 further characterized by said connecting tunnel being defined by said at least one side wall which angles said abutment wall at a left hand disposition.

10. An assembly as defined in claim 9 further characterized by said swap out plate having a plurality of locating pins disposed thereabout and engaging with corresponding openings in said first face of said load lock.

11. An assembly as defined in claim 9 further characterized by said partial chamber within said load lock being sized so that said substrate is disposed in part within the partial chamber defined by said load lock and within said partial chamber defined by said swap out plate.

12. An assembly as defined in claim 2 further characterized by said swap out plate having said at least one side wall with a length substantially equal to the distance between the given point and said abutment wall.

13. An assembly as defined in claim 9 further characterized by said at least one side wall having a length substantially equal to the distance between the given point and the abutment wall.

14. An assembly as defined in claim 1 further characterized by said load lock first face and said transport chamber second face each has an angle difference of zero degrees relative to one another and said swap out plate includes a connecting tunnel defined by two sidewalls extending outwardly therefrom and interconnected by an abutment wall.

15. An assembly as defined in claim 14 further characterized by said side walls having a length substantially equal to the distance between the given point and the abutment wall.

16. An assembly as defined in claim 15 further characterizing in that said horizontally extending slot is disposed in said abutment wall and said abutment wall is a vertically extending end wall of said connecting tunnel.

17. A load lock having means for moving a plurality of substrates between atmosphere and a vacuum environment comprising:
   a housing having given dimensions defining a partial chamber therein opening to a first face, said load lock defining a given point on which the center of a substrate is supported, said given point being a standard centrally disposed point relative to said given dimensions of said housing;
   a swap out plate secured to said load lock and covering said first face thereof; said swap out plate defining a partial chamber therein communicating directly and continuously with said partial chamber of said load lock to define together an enclosure therein, said swap out plate having an abutment wall and having a horizontally extending slot allowing communication of a substrate into said enclosure from a point outwardly thereof; and
   a substrate support secured to said load lock for supporting a substrate thereon such that the supported substrate when disposed within said enclosure extends between the swap out plate partial chamber and said load lock partial chamber.

18. A load lock as defined in claim 17 further characterizing in that said swap out plate includes at least one side wall and said horizontally extending slot is disposed in said abutment wall perpendicularly connected to said at least one side wall.

19. A load lock as defined in claim 18 further characterizing in that said at least one side wall has a length substantially equal to the distance between the given point and the abutment wall.

20. A processing station including:
- a load lock having means for moving a plurality of substrates between atmosphere and a vacuum environment and having a partial chamber therein opening to a first face, said load lock defining a given point on which the center of a substrate is supported, said given point being a standardly located point as found between one load lock and another;
- a transfer device secured to said load lock for moving substrates from one position outside the load lock to another position inside the load lock;
- a transport chamber disposed adjacent said load lock and having a second face disposed generally oppositely of the first face of said load lock and at a given angle;
- a transport apparatus disposed within the transport chamber and having at least one substrate holder for engaging and moving a substrate from the another position within the load lock to one or more processing stations disposed about the transport chamber; said transport apparatus moving said substrate holder a given stroke length along a given radius from a central axis;
- a connecting tunnel positioned between said load lock and said transport station and defining a partial chamber therewithin communicating continuously and directly with said partial chamber of said load lock to define together an enclosure therewithin and said connecting tunnel having a horizontally disposed slot located in an abutment face thereof and communicating with a like slot in said second face of said transport chamber;
- said transfer device supporting a substrate within said load lock such that the substrate extends between the partial chambers of both said load lock and said connecting tunnel; and
- wherein said connecting tunnel having said abutment wall integrally connected to at least one sidewall extending from said load lock and having a length sufficient to locate said abutment wall at a desired angular orientation corresponding to said given angle of said second face of said transport chamber and to locate said abutment wall at a given distance from said given point so as to uniformly locate said abutment wall in corresponding engagement with the second face of said transport chamber such that the center of the substrate supported in said load lock is spaced from said central axis at a given distance irrespective of the angular orientation which exist between the load lock first face and the transport chamber second face.

21. A processing station as defined in claim 20 further characterized by said transfer device including at least one substrate supporting structure which is complementarily engagable with the substrate holder of the transport apparatus.

22. A processing station as defined in claim 20 further characterized by at least one substrate supporting structure being an end effector which is oriented in line with the stroke of said substrate holder to effect complementary engagement between the end effector and the substrate holder of the transport apparatus.

* * * * *